(12) United States Patent
Honda et al.

(10) Patent No.: US 10,907,248 B2
(45) Date of Patent: Feb. 2, 2021

(54) MANUFACTURING METHOD OF MAGNETIC RECORDING MEDIUM, FILM FORMATION SYSTEM OF MULTILAYER FILM, AND FILM FORMATION ADJUSTMENT METHOD

(71) Applicant: Kabushiki Kaisha Toshiba, Tokyo (JP)

(72) Inventors: Masaki Honda, Yokohama Kanagawa (JP); Kenji Iwasa, Inagi Tokyo (JP); Hidetaka Eguchi, Yokkaichi Mie (JP)

(73) Assignee: Kabushiki Kaisha Toshiba, Tokyo (JP)

( * ) Notice: Subject to any disclaimer, the term of this patent is extended or adjusted under 35 U.S.C. 154(b) by 534 days.

(21) Appl. No.: 15/703,609

(22) Filed: Sep. 13, 2017

(65) Prior Publication Data

US 2018/0274086 A1 Sep. 27, 2018

(30) Foreign Application Priority Data

Mar. 22, 2017 (JP) .................................. 2017-055371

(51) Int. Cl.
| | |
|---|---|
| *C23C 14/34* | (2006.01) |
| *C23C 14/54* | (2006.01) |
| *C23C 14/14* | (2006.01) |
| *G11B 5/64* | (2006.01) |
| *G11B 5/851* | (2006.01) |

(52) U.S. Cl.
CPC ............. *C23C 14/545* (2013.01); *C23C 14/14* (2013.01); *C23C 14/34* (2013.01); *G11B 5/647* (2013.01); *G11B 5/851* (2013.01)

(58) Field of Classification Search
CPC ......... C23C 14/14; C23C 14/35; C23C 14/54; C23C 14/545; G11B 5/645; G11B 5/647; G11B 5/73; G11B 5/851
USPC ............................. 204/192.2, 298.03, 192.13
See application file for complete search history.

(56) References Cited

U.S. PATENT DOCUMENTS

| | | | |
|---|---|---|---|
| 8,170,833 B2 | 5/2012 | Vuong et al. | |
| 8,688,256 B2 | 4/2014 | Cheng et al. | |
| 2010/0312374 A1 | 12/2010 | Tsai et al. | |
| 2014/0186975 A1* | 7/2014 | Buller | H02S 50/00 |
| | | | 438/7 |

FOREIGN PATENT DOCUMENTS

| | | |
|---|---|---|
| CN | 101118422 A | 2/2008 |
| CN | 101908495 A | 12/2010 |
| JP | 2016-125108 A | 7/2016 |

* cited by examiner

*Primary Examiner* — Rodney G McDonald
(74) *Attorney, Agent, or Firm* — White & Case LLP

(57) ABSTRACT

According to one embodiment, a manufacturing method of a magnetic recording medium includes measuring characteristics of multilayer film including a magnetic recording layer, calculating a residual between an index value to set a sputtering power and the characteristics, acquiring a feedback correction factor by calculating moving average deviations of the residual, and calculating a new index value of each layer in the multilayer film by using a calculation model which estimates the characteristics from calculated film thicknesses using a virtual metrology technique, referring to the feedback correction factor and performing backward calculation with a solver using an electronic calculator.

5 Claims, 4 Drawing Sheets

MANUFACTURING METHOD OF MAGNETIC RECORDING MEDIUM, FILM FORMATION SYSTEM OF MULTILAYER FILM, AND FILM FORMATION ADJUSTMENT METHOD

CROSS-REFERENCE TO RELATED APPLICATIONS

This application is based upon and Claims the benefit of priority from Japanese Patent Application No. 2017-055371, filed Mar. 22, 2017, the entire contents of which are incorporated herein by reference.

FIELD

Embodiments described herein relate generally to a manufacturing method of a magnetic recording medium, film formation system of multilayer film, and film formation adjustment method.

BACKGROUND

In a manufacturing process of magnetic recording media, each layer of a multilayer film is formed through a successive sputtering process inside connected chambers.

To stabilize the magnetic characteristics of the magnetic recording media, it is required that each layer in the multilayer film is sputtered to be a certain film thickness; however, measuring a film thickness of each layer during the sputtering process is impossible because the film formation is performed successively.

DETAILED DESCRIPTION

Figure 1:
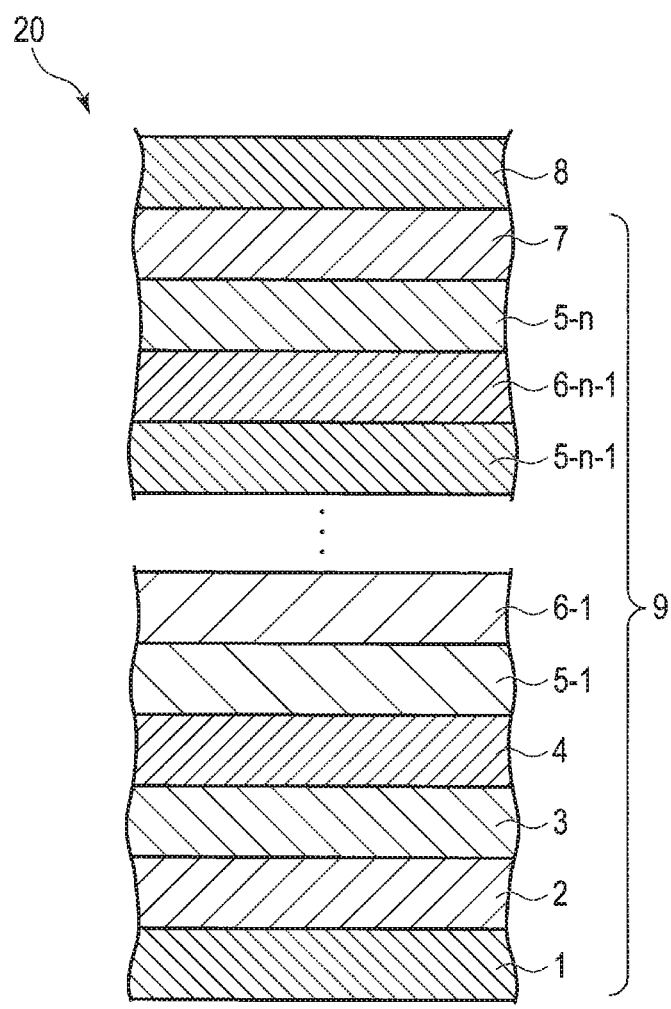
FIG. 1 is a cross-sectional view of an example of a magnetic recording medium formed through a method of an embodiment.

In a manufacturing method of a magnetic recording medium of an embodiment, multilayer film including a magnetic recording layer is successively formed with a sputtering device in which a calculated film thickness of each layer of the multilayer film is calculated using a virtual metrology technique and an advanced process control (APC) model used to estimate the characteristics from the calculated film thickness is prepared and used.

This method includes, firstly, taking samples of multilayer film including a magnetic recording layer from the sputtering device at certain time intervals, measuring a measured value of characteristics of the multilayer film including the magnetic recording layer formed with a first sputtering power on the basis of a first index value, calculating a residual by acquiring a differential between the first index value and the measured value, acquiring a feedback correction factor c by calculating moving average deviations of the residual, referring to the feedback correction factor c to calculate a second index value used to set a sputtering power in each layer of the multilayer film from a value obtained from backward calculation of the APC calculation model with a solver using an electronic calculator, sending the second index value to a film formation controller of the sputtering device, and setting a sputtering power receiving the second index value from the film formation controller and successively sputtering each layers including the magnetic recording layer to form the multilayer film on a substrate.

According to an embodiment, using the virtual metrology technique and performing the advanced process control (APC) on the basis of film thicknesses, unevenness in the characteristic values of the magnetic recording medium can be reduced.

Here, the multilayer film is a laminated product including a magnetic recording layer and one or more other layers.

The other layers will be, for example, a layer between the substrate and the magnetic recording layer, that is, an underlayer or the like, a soft magnetic underlayer, a cap layer provided on the magnetic recording layer, or a protection layer.

Furthermore, a film formation system for the multilayer film of an embodiment is, for example, a film formation system applicable to the manufacturing method of the magnetic recording medium of the embodiment, and the system includes, an APC calculation model configured to perform multiple regression analysis of calculated film thicknesses using a virtual metrology technique with respect to the multilayer film, a solver configured to perform backward calculation of the APC calculation model and to calculate an index value to set a sputtering power, an APP indicator configured to send the index value to set the sputtering power, a sputtering device including a film formation controller configured to control a plurality of film forming chambers on the basis of the index value, a measure configured to measure characteristics of the multilayer film formed in the sputtering device at certain time intervals, a residual calculator configured to calculate a differential between the measured value and the index value, and a moving average deviation calculator configured to acquire a feedback correction factor c inserted in the APC calculation model.

Furthermore, a film formation adjustment method of an embodiment is a film formation adjustment method in which each layer of multilayer film is successively formed by a sputtering device on the basis of an index value used to set a sputtering power, the method includes, taking samples of multilayer film including a magnetic recording layer from the sputtering device at certain time intervals, measuring a measured value of characteristics of the multilayer film including the magnetic recording layer formed with a first sputtering power on the basis of a first index value, calculating a residual by acquiring a differential between the first index value and the measured value, calculating moving average deviations of the residual to acquire a feedback correction factor c, referring to the feedback correction factor c to acquire calculated film thicknesses of the multilayer film including the magnetic recording layer using a virtual metrology technique as a value calculated backward from an APC calculation model using a solver, acquiring a second index value on the basis of the value, sending the second index value to a film formation controller of the sputtering device, and setting a second sputtering power from the received second index value and successively forming each layer of the multilayer film.

Hereinafter, embodiments will be described with reference to the accompanying drawings.

FIG. 1 is a cross-sectional view of an example of a magnetic recording medium 20 formed by a method or a system of an embodiment. The magnetic recording medium 20 is a perpendicular magnetic recording medium.

As in the figure, the magnetic recording medium 20 includes, on a non-magnetic substrate 1, a soft magnetic underlayer 2, first underlying layer 3, second underlying layer 4, a multilayer film 9 including a first magnetic layer 5-1, first intermediate layer 6-1, nth−1 magnetic layer 5-n−1, nth−1 intermediate layer 6-n−1, nth magnetic layer 5-n, and nth+1 magnetic layer 7, C protection layer 8 layered on the multilayer film 9 by deposition in a chemical vapor deposition (CVD) device, and a lubricant layer (not shown) applied on the C protection layer 8, which are successively layered in the order stated by sputtering in a sputtering device.

In the magnetic recording medium 20, for example, the soft magnetic underlayer 2 is formed of Ni—Fe, first underlying layer 3 and second underlying layer 4 are formed c Ru, fir at magnetic layer 5-1 to nth magnetic layer 5-n are formed of CoCrPt—$O_x$, first intermediate layer 6-1 to n−1th intermediate layer 6-n−1 are formed of Ru, and nth+1 magnetic layer 7 is formed of CoCrPt—B.

Note that x is an atom ratio of the oxygen atom.

Furthermore, nth−1 magnetic layer 5-n−1 and nth−1 intermediate layer 6-n−1 are formed by layering first magnetic layer 5-1 and first intermediate layer 6-1 by n−1 times.

Here, n is an integer which is two or more, and n is, for example, three or five.

The soft magnetic underlayer 2 may be a multilayer including, for example, a first soft magnetic layer, intermediate layer, and second soft magnetic layer.

A multilayer of the first magnetic layer 5-1, first intermediate layer 6-1, nth−1 underlying layer 5-n−1, and nth magnetic layer 6-n may be used as a magnetic recording layer, and the nth+1 magnetic layer 7 may be used as a cap layer.

The magnetic recording medium 20 is, as shown in FIG. 1, manufactured through sputtering, and a recording device including the magnetic recording medium 20 can secure the read/write performance when each layer in the magnetic recording medium 20 functions.

Figure 2:
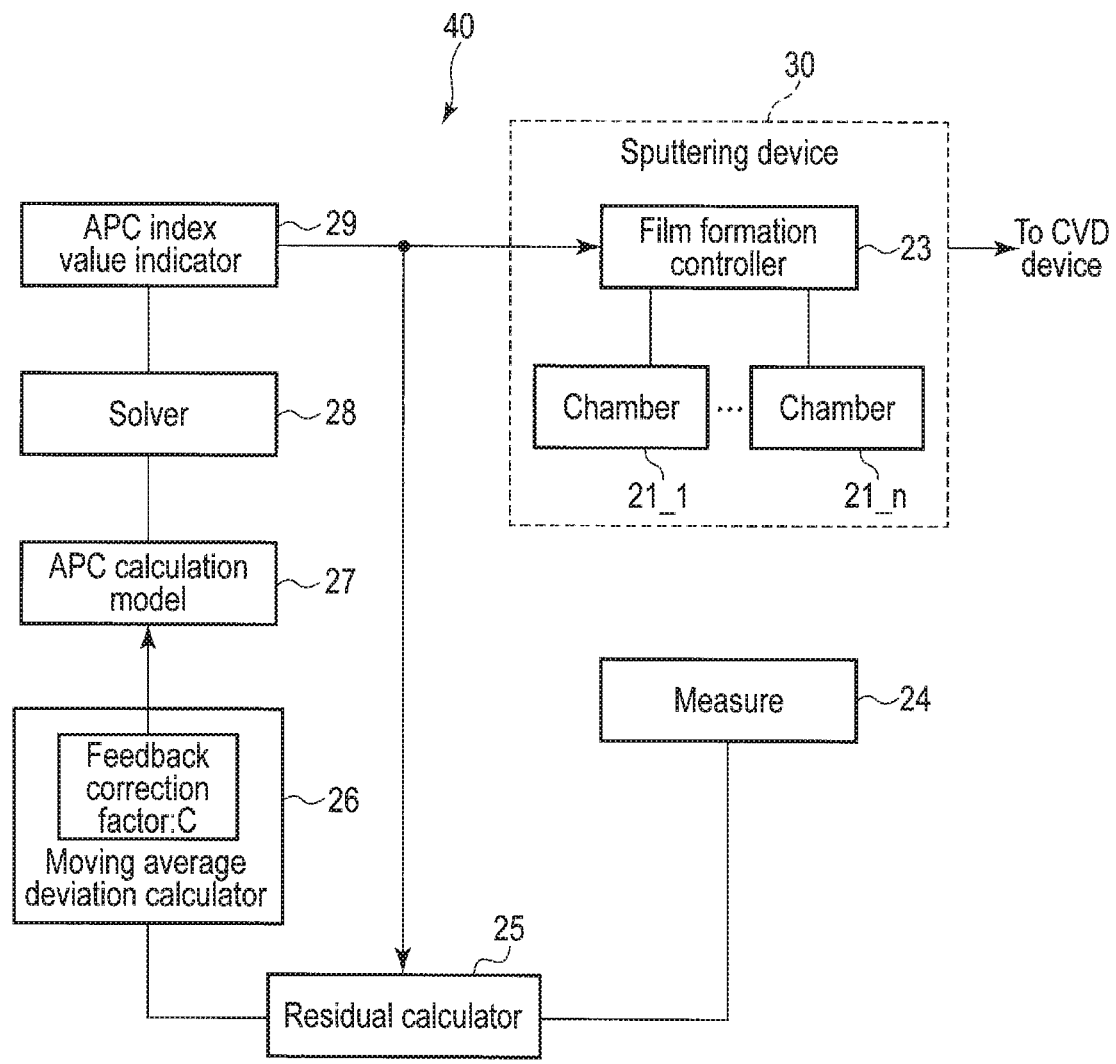
FIG. 2 is a block diagram showing a film formation system of multilayer film.

FIG. 2 is a block diagram showing a film formation system of the multilayer film used in a manufacturing method of the magnetic recording medium of the embodiment.

As shown in the figure, a film formation system 40 includes a sputtering device 30 which successively sputters each layer of the multilayer film on a substrate 1.

The sputtering device 30 includes a film formation controller 23 and chambers 21_1 to 21_n communicating each other in order to form each layer of the multilayer film including n layers. Chambers 21_1 to 21_n of the sputtering device 30 are each connected to the film formation controller 23 and a sputtering power and a film formation time are set to each chamber. Furthermore, an advanced process control (APC) indicator 29 used for setting the sputtering power is connected to the film formation controller 23. The film formation controller 23 can adjust the sputtering power of each chamber receiving an APC index value from the APC indicator 29.

Furthermore, the film formation system 40 includes a measure 24 which measures characteristics of the multilayer film formed by the sputtering device 30, residual calculator 25 provided between the measure 24 and the APC indicator 29 to calculate a residual between a measured value and an APC index value, moving average deviation calculator 26 which calculates moving average deviations of the residual to acquire a feedback correction factor c, solver 28 which acquires an APC index value by performing backward calculation from the APC calculation model, and APC indicator 29 which outputs the APC index value acquired by the solver 28. Here, the characteristics of the multilayer film measured by the measure 24, the APC index value output from the APC indicator 29, and the sputtering power adjusted by the film formation controller 23 have a correspondence relationship.

Figure 3:
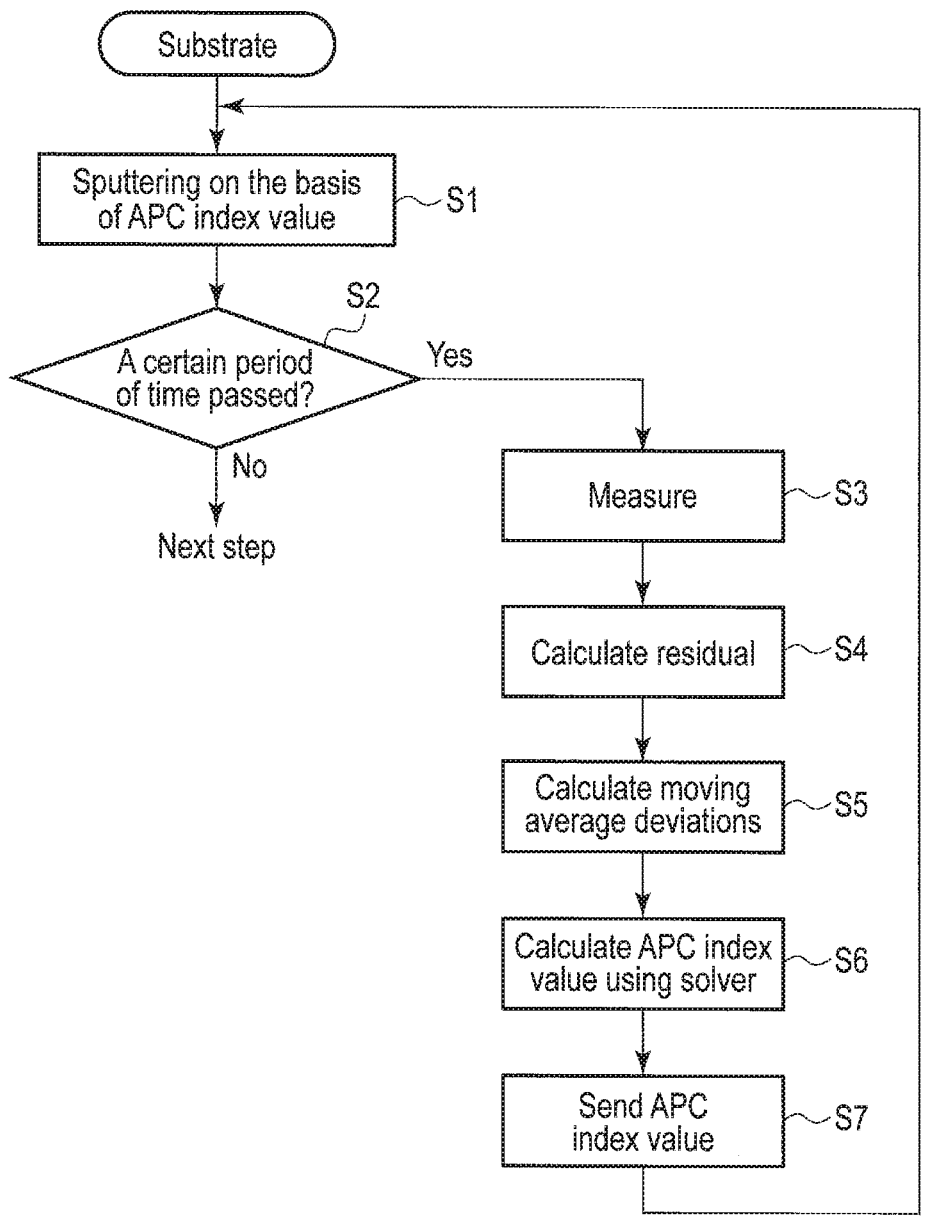
FIG. 3 is a flowchart of the film formation process of the multilayer film of the embodiment.

FIG. 3 is a flowchart showing a film formation process of the multilayer film used in the manufacturing method of the magnetic recording medium of the embodiment.

As in the figure, in the manufacturing process of the multilayer film used in the embodiment, base materials are initially introduced in the sputtering device 30, a fixed film formation time is set, and each of layer including a magnetic recording layer of the multilayer film is successively formed in a plurality of chambers 21_1 to 21_n with a sputtering power set on the basis of the an APC index value input from the APC indicator 29 (S1).

The multilayer film obtained as above can be transferred to a next step which is, for example, a CVD device to form a protection film 11. Then, a lubricant such as perfluoropolyether is applied to the protection film 11, and the magnetic recording medium 20 is obtained. Here, whether a certain period of time is passed or not is determined (S2), and if it is not (NO in S2), the process proceeds to the next step.

On the other hand, if a certain period of time such as twelve hours is passed (YES in S2), a sample is taken out in the measure 24 to measure the characteristics thereof (S3).

In the residual calculator 25, a measured value and a current APC index value are compared and a residual is calculated (S4).

In the moving average deviation calculator 26, moving average deviations of the residual obtained as above is acquired as a feedback correction factor c (S5). For example, a moving average of residuals in past three or earlier lots will be used.

In the solver 28, an APC index value used to set a sputtering power is derived by backward calculation from an APC calculation model 27 (S6).

The APC index value is sent to the film formation controller 23 of the sputtering device 30 (S7).

In the film formation controller 23, each layer including a magnetic recording layer of the multilayer film is successively formed with a new sputtering power set on the basis of the new APC index value (S1).

The principle of the film formation system 40 of the above multilayer film is explained as follows.

In the film formation system 40, a film formation time is fixed while a sputtering power is changed at certain time intervals corresponding to erosion of sputtering targets in order to adjust the characteristics and film thicknesses.

The magnetic recording medium 20 tends to change its characteristics from the inner periphery toward the outer periphery, and in order to adjust the characteristics, a TM distance (a gap between a sputtering target and a magnet) is used as an adjustment parameter.

Control factors X of the sputtering device are as follows.
Control factors: X
Sputtering power
Film formation time
Target integrated power (index indicative of erosion)
TM distance
Control targets Y of the characteristics of the magnetic recording medium 20 are as follows.
Control targets: Y
Electrostatic characteristics: Hc, Hs, Hn, α each ID/MD/OD . . . m parameter
Motion characteristics: SN ratio, OW characteristics, line width, and the like . . . n parameter.

In the manufacturing method of the magnetic recording medium 20, a film thickness model which describes media characteristics with a film thickness. Since a film thickness of each layer of the multilayer film cannot be measured directly, calculated film thicknesses of a virtual metrology technique will be used. The film thickness model can be described in the following formulae (1) and (2).

Calculated film thickness Cal_$TH_1$=$PW_1$×film formation rate$_1$×film formation time  (1)

Film formation rate$_1$=$e_1$×$d_1$×integrated power$_1$  (2)

Figure 4:
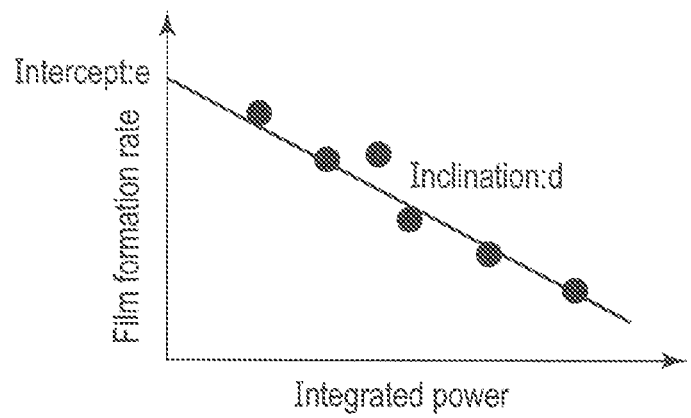
FIG. 4 is a graph showing a relationship between a film formation rate and an integrated power.

The film formation rate is represented by a linear function of the integrated power as shown in FIG. 4, The APC calculation model is prepared by multiple regression analysis where control targets are Y and the film thickness of VM is X.

The characteristics of the control targets can be represented by the following determinant (3).

$$\begin{bmatrix} Y_1 \\ \vdots \\ Y_{(m+n)} \end{bmatrix} = \begin{bmatrix} a_{11} & \cdots & a_{1p} \\ \vdots & \ddots & \vdots \\ a_{(m+n)1} & \cdots & a_{(m+n)p} \end{bmatrix} \times \begin{bmatrix} Cal\_TH_1 \\ \vdots \\ Cal\_TH_{(m+n)} \end{bmatrix} + \begin{bmatrix} b_1 \\ \vdots \\ b_{(m+n)} \end{bmatrix} + \begin{bmatrix} c_1 \\ \vdots \\ c_{(m+n)} \end{bmatrix} \quad (3)$$

In this example, there are two intercepts b and c, and b is an ordinary intercept while c is an inter-maintenance correction factor which is necessary to explain a maintenance jump and is a feedback correction factor on the basis of a residual of the characteristics.

As the model being prepared, characteristics Y can be estimated from the control factors X while a sputtering power actually used must be calculated in the APC.

Deriving X is referred to as backward calculation. An optimizing solver is used in the backward calculation.

The backward calculation is an optimization problem to acquire p control factors X from n characteristics Y.

The optimization problem is mainly performed to minimize a differential between characteristics Y from the targets; however, as in the following formula, a differential between the characteristics Y and film thickness target values is minimized as well to stably derive solution. Furthermore, each parameter has a restrictive condition, and the solution can be derived within a particular range.

Target function x: Sputtering power, Y: Characteristics, Th: Film thickness $$\Delta^2 = \Delta Y^2 + \Delta Th^2 \quad (4)$$

$$\Delta Y^2 = \sum_i (\Delta Y_i + \lambda_i)^2 \quad (5)$$

$$\Delta Th^2 = \sum_{j=1} ((Th_j - Th_{j,target})/\sigma_j \times \varepsilon_j)^2 \quad (6)$$

$\Delta^2$: Target function value (Parameter minimized by optimization)
$\Delta Y_i = (Y_{i,APC} - Y_{i,Target})/(Y_{i,USL} - Y_{i,LSL})$ Dimensionless differential from a desired value (target) of characteristics
$A_i$: Penalty coefficient of characteristic i with respect to a shift from target
$E_j$: Penalty coefficient with respect to a distance from target film thickness
$\Sigma j$: Calculated film thickness of past result
APC: APC index value
USL: Upper specific limit
LSL: Lower specific limit
I: ith layer from the bottom of multilayer film
J: jth layer from the bottom of multilayer film
Restrictive Condition $$Y_{i,LSL} \leq Y_i \leq Y_{i,USL} \quad (7)$$

$$X_{i,LSL} \leq X_i \leq X_{i,USL} \quad (8)$$

$$Cal\_TH_{i,LSL} \leq Cal\_TH_i \leq Cal\_TH_{i,USL} \quad (9)$$

In formula (9), the value of calculated film thickness falls within the specification.

The value Y calculated by the solver 28 will be referred to as APC index value. A differential between the APC index value and a value corresponding to the measured value will be referred to as a residual. The residual is calculated by the residual calculator 25.

The residual is used as a feedback value in a next calculation of APC index value. If the residual is simply used as a feedback value, APC index value may not be stabilized and may oscillate, moving average deviations are calculated as a feedback correction factor. With moving average, an increase of variation in feedback signals can be suppressed whereas a phase delay occurs.

The residual includes variation in each medium and variation in measurement. Variations cause noises in the feedback signals, and thus, variations in measurement and production must be decreased for highly accurate APC.

Note that the following materials can be used in the magnetic recording medium 20 of the embodiment.

<Protection Film and Lubricant>

The protection layer can be formed of carbon.

The protection film is, preferably, formed through a CVD method in order to exert good coverage on the surface asperity; however, the film may be formed through a sputtering method or a vacuum deposition method. Through the CVD method, a DLC film containing much $sp^3$ bonding carbons. If the film thickness is 2 nm or less, the coverage is poor and if the film thickness is 10 nm or more, a signal-to-noise (SNR) ratio decreases since the magnetic spacing between the read/write head and the magnetic recording medium 20 becomes wider in the recording device with the magnetic recording medium 20. Thus, the above range should be avoided.

Furthermore, a lubricant can be applied on the protection film. The lubricant will be, for example, perfluoropolyether, fluoroalcohol, fluorocarboxylic acid.

<Magnetic Recording Layer>

If an alloy is used for the magnetic recording layer, it, preferably, contains Co, Fe, or Ni mainly with Pt or Pd. The magnetic recording layer may contain Cr or an oxide, if necessary. As the oxide, a silicon oxide or a titanium oxide is suitable. Furthermore, an addition to the oxide, one or more elements selected from Ru, Mn, B, Ta, Cu, and Pd will be contained. With the above element or elements, crystallization and orientation can be improved, and thus, recording and reproducing characteristics and heat fluctuation characteristics more suitable for higher density recording can be achieved.

The magnetic recording layer may be formed of a multilayer structure of a combination of CoPt alloy, FePt alloy, CoCrPt alloy, FePtCr alloy, CoPtO, FePtO, CoPtCrO, FePtCrO, CoPtSi, of FePtSi, or an alloy containing at least one selected from a group of Pt, Pd, Ag, and Cu, and Co, Fe, and Ni. Furthermore, an MnAl alloy, SmCo alloy, FeNbB alloy, and CrPt alloy with highly Ku may be used.

The film thickness of the magnetic recording layer is, preferably, 3 to 30 nm, or more preferably, 5 to 15 nm. Within these ranges, a magnetic recording/reproducing device more suitably for higher recording density can be manufactured. If the thickness of the magnetic recording layer is less than 3 nm, read output becomes too low and noise components may be higher. If the thickness of the magnetic recording layer is more than 30 nm, the read output becomes too high and waveforms may be distorted.

<Soft Magnetic Underlayer>

The soft magnetic underlayer (SUL) partly functions to pass a recording field from a magnetic head configured in order to magnetize the magnetic recording layer in a longitudinal direction and to send back to the magnetic head side. The soft magnetic underlayer thus applies a steep and sufficient perpendicular magnetic field to the recording layer in order to increase the read/write efficiency.

The soft magnetic underlayer is formed of a material containing Fe, Ni, or Co. Such a material may be an FeCo alloy such as FeCo, FeCoV, FeNi alloy such as FeNi, FeNiMo, FeNiCr, FeNiSi, FeAl alloy, FeSi alloy such as FeAl, FeALSi, FeAlSiCr, FeAlSiTiRu, FeAlO, FeTa alloy such as FeTa, FeTaC, FeTaN, and FeZr alloy such as FeZrN. A material with a microcrystalline structure such as FeAlO, FeMgO, FeTaN, and FeZrN with Fe of 60 at % may be used, or a material with a granular structure in which microcrystalline particles are dispersed in a matrix may be used. Or, the soft magnetic underlayer may be formed of a Co alloy containing Co and at least one of Zr, Hf, Nb, Ta, Ti and Y. Such a Co alloy, preferably, contain Co of 80 at % or more. An amorphous layer is easily formed in such a Co alloy when being formed through sputtering. An amorphous soft magnetic material does not include a crystal magnetic anisotropy, crystal defection, or grain field, and thus, shows excellent soft magnetization and noise in the magnetic recording medium 20 can be decreased. A suitable amorphous soft magnetic material may be, for example, CoZr, CoZrNb, and CoZrTa alloy.

An underlying layer may be disposed below the soft magnetic underlayer to improve the crystallization of the soft magnetic underlayer or to increase adhesiveness to the substrate. Such an underlying layer may be formed of Ta, Ta, W, Cr, Pt, or an alloy containing such elements, or an oxide or nitride of such elements.

To prevent a spike noise, a soft magnetic underlayer may be separated into several layers and Ru layers of 0.5 to 1.5 nm may be inserted therebetween as intermediate layers to establish antiferromagnetic bonding. Furthermore, an exchange bonding may be established between hard magnetic films having in-lane anisotropy such as CoCrPt, SmCo, or FePt, or pin layers formed of an antiferromagnetic material such as IrMn or PtMn and soft magnetic layers. To control the exchange bonding force, a magnetic film (for example, Co) or a nonmagnetic film (for example, Pt) may be disposed above and below the Ru layers.

<Intermediate Layer>

An intermediate layer of nonmagnetic material may be interposed between the soft magnetic underlayer and the magnetic recording layer. The intermediate layer functions two ways: blocking an exchange bonding mutual effect between the soft magnetic underlayer and the magnetic recording layer; and controlling the crystallization of the magnetic recording layer. The intermediate layer may be formed of Ru, Pt, Pd, W, Ti, Ta, Cr, Si, Ni, Mg, or an alloy containing such elements, or an oxide or a nitride of such elements.

<Nonmagnetic Substrate>

A nonmagnetic substrate used in the embodiment will be a glass substrate, Al alloy substrate, ceramic substrate, carbon substrate, or Si monocrystalline substrate having an oxidized surface. The glass substrate may be formed of an amorphous glass or a crystallization glass. The amorphous glass may be a conventional soda lime glass, or an aluminosilicate glass. The crystallization lass may be a lithium crystallization glass. The ceramic substrate may be a sintered body mainly containing a conventional aluminum oxide, aluminum nitride, or silicon nitride or a fibre reinforcement body thereof.

Figure 5:
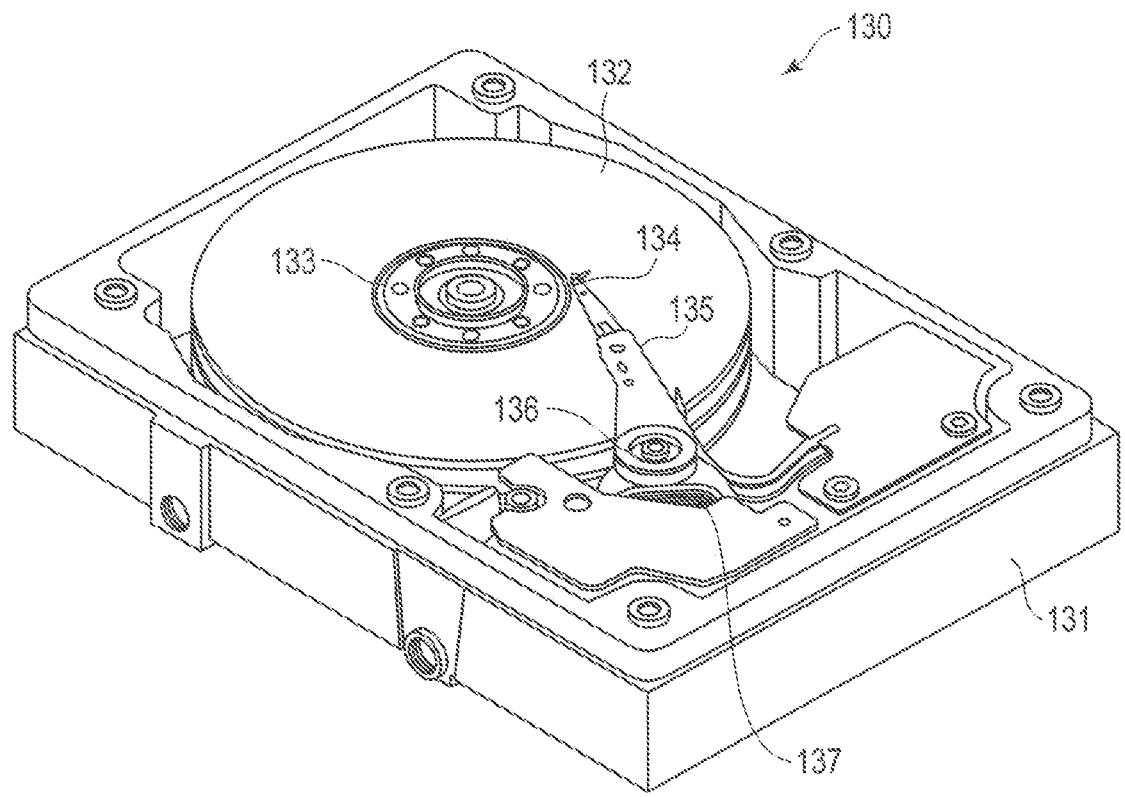
FIG. 5 is a perspective view of an example of a magnetic recording and reproducing apparatus to which the magnetic recording medium manufactured through the method of the embodiment can be applied, in a partly disassembled manner.

FIG. 5 is a perspective view of an example of a magnetic recording/reproducing device 130 to which the magnetic recording medium 20 manufactured through the method of the embodiment, in a partly disassembled manner.

As shown in the figure, the magnetic recording/reproducing device 130 includes a rectangular box-like body 131 upper surface of which opens, and a top cover (which is not shown) attached to the body 131 with a plurality of screws to close the upper end opening of the body.

The body 131 accommodates a magnetic recording medium 132 of the embodiment, spindle motor 133 as a driver configured to support and rotate the magnetic recording medium 132, magnetic head 134 configured to record and resume magnetic signals with respect to the magnetic recording medium 132, head actuator 135 including a suspension with the magnetic head 134 mounted on its tip and movably supporting the magnetic head 134 with respect to the magnetic recording medium 132, rotation axis 136 rotatably supporting the head actuator 135, and voice coil motor 137 configured to rotate and position the head actuator 135 through the rotation axis 136, for example.

While certain embodiments have been described, these embodiments have been presented by way of example only, and are not intended to limit the scope of the inventions. Indeed, the novel embodiments described herein may be embodied in a variety of other forms; furthermore, various omissions, substitutions and changes in the form of the embodiments described herein may be made without departing from the spirit of the inventions. The accompanying Claims and their equivalents are intended to cover such forms or modifications as would fall within the scope and spirit of the inventions.

What is claimed is:

1. A manufacturing method of a magnetic recording medium in which a multilayer film including a magnetic recording layer is formed successively on the basis of index values to set a sputtering power with a sputtering device, the manufacturing method comprising:

calculating a residual between a first index value and a measured value of characteristics of a sample of the multilayer film including the magnetic recording layer formed with a first sputtering power on the basis of a first index value, which is measured by taking from the sputtering device at certain time intervals;

calculating moving average deviations of the residual to acquire a feedback correction factor c;

referring to the feedback correction factor c to acquire a value calculated backward from an advanced process control calculation model using a solver as a calculated film thickness of the multilayer film including the magnetic recording layer using a virtual metrology;

sending a second index value on the basis of the value to the sputtering device; and setting a second sputtering power on the basis of the second index value and successively forming the multilayer film including the magnetic recording layer, wherein the advanced process control calculation model is represented by the following formula (3)

$$\begin{bmatrix} Y_1 \\ \vdots \\ Y_{(m+n)} \end{bmatrix} = \begin{bmatrix} a_{11} & \cdots & a_{1p} \\ \vdots & \ddots & \vdots \\ a_{(m+n)1} & \cdots & a_{(m+n)p} \end{bmatrix} \times \begin{bmatrix} Cal\_TH_1 \\ \vdots \\ Cal\_TH_{(m+n)} \end{bmatrix} + \begin{bmatrix} b_1 \\ \vdots \\ b_{(m+n)} \end{bmatrix} + \begin{bmatrix} c_1 \\ \vdots \\ c_{(m+n)} \end{bmatrix} \quad (3)$$

where Y is a control target, Cal_TH is a calculated film thickness, a is a coefficient, be is an intercept, c is a feedback correction factor, m is a number, n is a number, and p is a number.

2. The method of claim 1, wherein the magnetic recording layer is a perpendicular magnetic recording layer.

3. The method of claim 2, wherein the magnetic recording layer including a multilayer structure of a combination of a CoPt alloy, CoCrPt alloy, FePtCr alloy, CoPtO alloy, or an alloy including CoPtO, FePtO, CoPtCrO, FePtCrO, CoPtSi, or FePtSi or including at least one of Pt, Pd, Ag, and Cu, and Co, Fe, or Ni.

4. The method of claim 1, wherein the forming of the multilayer film including the magnetic recording layer further includes forming a soft magnetic underlayer between the substrate and the magnetic recording layer.

5. A film formation adjustment method of a film formation system in which multilayer film is formed successively on the basis of an index value to set a sputtering power with a sputtering device, the method comprising:

calculating a residual between a measured value of characteristics of a sample of the multilayer film formed with a first sputtering power on the basis of a first index value, which is measured by taking from the sputtering device at certain time intervals;

calculating moving average deviations of the residual to acquire a feedback correction factor c;

referring to the feedback correction factor c to acquire a value calculated backward from an advanced process control calculation model using a solver as a calculated film thickness of the multilayer film using a virtual metrology;

sending a second index value on the basis of the value to the sputtering device; and setting a second sputtering power on the basis of the second index value and successively forming the multilayer film;

wherein the advanced process control calculation model is represented by the following $$\begin{bmatrix} Y_1 \\ \vdots \\ Y_{(m+n)} \end{bmatrix} = \begin{bmatrix} a_{11} & \cdots & a_{1p} \\ \vdots & \ddots & \vdots \\ a_{(m+n)1} & \cdots & a_{(m+n)p} \end{bmatrix} \times \begin{bmatrix} Cal\_TH_1 \\ \vdots \\ Cal\_TH_{(m+n)} \end{bmatrix} + \begin{bmatrix} b_1 \\ \vdots \\ b_{(m+n)} \end{bmatrix} + \begin{bmatrix} c_1 \\ \vdots \\ c_{(m+n)} \end{bmatrix} \quad (3)$$

where Y is a control target, Cal_TH is a calculated film thickness, a is a coefficient, b is an intercept, c is a feedback correction factor, m is a number, n is a number, and p is a number.

* * * * *